MONOSTABLE MULTIVIBRATOR CIRCUITS

Filed March 21, 1962

INVENTOR
William J. Mahoney

BY [signature]

ATTORNEY 3,268,737

MONOSTABLE MULTIVIBRATOR CIRCUITS

William J. Mahoney, Darien, Conn., assignor to American Machine & Foundry Company, a corporation of New Jersey Filed Mar. 21, 1962, Ser. No. 181,337
5 Claims. (Cl. 307—88.5)

This invention relates to monostable multivibrator circuits and to triggered one-shot oscillator circuits.

Monostable multivibrator circuits are commonly employed to produce uniform output pulses in response to applied trigger pulses and such circuits normally have a stable state and a quasi-stable state. The circuit changes to the quasi-stable state in response to a trigger pulse and a predetermined time interval thereafter, as determined by the time constant of the circuit, automatically changes back to the stable state. The output pulses are produced while the circuit is in the quasi-stable state and such pulses are of a uniform time duration and have sharp turn on and cut off characteristics.

With conventional monostable multivibrator circuits, it is very difficult, and often impossible, to obtain high current output pulses, particularly when the pulses are to be applied to inductive loads. Where high current pulses are required, as, for example, when driving relays and the like, it has been common practice to couple a monostable multivibrator circuit to control a high power transistor switching circuit. Such an arrangement is not always satisfactory because transistors have a low inverse voltage rating and must be abnormally large in order to withstand the high inverse voltages generated by inductive loads. Conversely, devices such as diodes or condensers placed across relay coils to absorb the back electromotive force, tend to slow down the opening action of the relay.

It is therefore an object of this invention to provide a monostable multivibrator circuit capable of producing high current output pulses without external switching circuits.

It is another object to provide such a monostable circuit capable of supplying high current pulses to inductive loads and capable of blocking the high inverse voltage generated by such a load upon termination of the pulses.

Another object is to provide a semiconductor monostable multivibrator circuit wherein all the semiconductor devices employed are nonconductive when the circuit is in the stable state.

Still another object is to provide a monostable multivibrator circuit employing inherently stable silicon semiconductors exclusively.

A further object is to provide a four-layer diode circuit useful as a commutating circuit.

A triggered one-shot oscillator is in many respects similar to a monostable multivibrator in that it produces uniform output pulses in response to trigger pulses. Instead of momentarily changing to a quasi-stable state, the one-shot circuit usually produces the output pulse by a capacitor discharge and therefore the output pulse does not have a sharp cut off. It has been found that the same basic circuit employed to provide a monostable multivibrator in accordance with this invention can be employed in a one-shot circuit to eliminate a common problem, namely, the possibility of false triggering by noise pulses.

An additional object is therefor to provide a triggered one-shot circuit not susceptible to false triggering from noise pulses.

Yet another object is to provide a selectively operable triggered one-shot circuit.

In order that the manner in which these and other objects are attained in accordance with the invention can be understood in detail, reference is had to the accompanying drawings, which form a part of this specification, and wherein.

The monostable multivibrator circuit in accordance with this invention utilizes a silicon controlled rectifier to develop the high current output pulses. The silicon controlled rectifier is triggered to the conductive state by incoming applied trigger pulses which usually appear as voltage spikes. As is characteristic of a silicon controlled rectifier, once it is rendered conductive, it remains conductive until commutated by current starvation or an inverse voltage. Connected to the silicon controlled rectifier is a capacitor charging circuit which is enabled to begin charging when the silicon controlled rectifier is triggered to the conductive state. A four-layer diode is so connected across the capacitor that, when the capacitor is charged to the breakdown voltage of the diode, the diode becomes conductive, discharging the capacitor and commutating the controlled rectifier.

Silicon controlled rectifiers are well known for their very high current carrying capacity and high inverse voltage ratings, and therefore, since the output pulses developed by the monostable multivibrator in accordance with this invention are developed entirely by the silicon controlled rectifier, very high power output pulses and high inverse blocking can be obtained. It should be noted that between operating cycles of the monostable multivibrator both of the active elements, namely, the silicon controlled rectifier and the four-layer diode, are nonconductive and therefore the circuit has a minimum current drain when not in use. Also, the commercially available controlled rectifiers and four-layer diodes are silicon semiconductors and hence a circuit utilizing these elements exclusively takes advantage of the inherent temperature stability of these elements.

A triggered one-shot oscillator circuit in accordance with this invention similarly utilizes a four-layer diode connected across the capacitor of a capacitor charging circuit. In this circuit arrangement, the parameters are so selected that the fully charged capacitor cannot break down the four-layer diode. An external trigger pulse, however, when applied, causes the diode to break down, permitting the capacitor to discharge through the diode to produce the output pulse. An auxiliary circuit is connected so as to disable the charging circuit and the four-layer diode discharging circuit when the one-short circuit is not in use, to thereby prevent false triggering by noise pulses.

Figure 1:
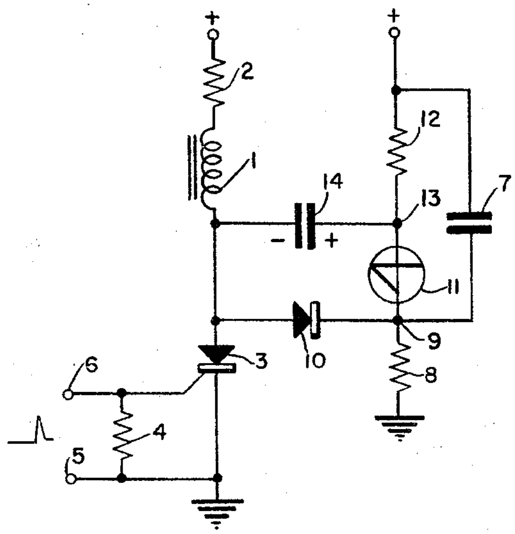
FIG. 1 is a schematic diagram illustrating a monostable multivibrator constructed in accordance with one embodiment.

In FIG. 1, a monostable multivibrator in accordance with this invention is illustrated as connected to energize an inductive load 1 such as the winding of an electromechanical relay. One end of winding 1 is connected to a positive source of potential through resistor 2, and the other end of the winding is connected to ground via the anode-cathode circuit of a silicon controlled rectifier 3. The gate element of the controlled rectifier is connected to ground via resistor 4 across which triggering pulses are applied, i.e., via input terminals 5 and 6.

A silicon controlled rectifier is a PNPN semiconductor device normally having a high impedance to current flow in both directions. If, when the anode is positive with respect to the cathode, a positive potential is applied to the gate element, the controlled rectifier breaks down and conducts current from the anode to the cathode presenting very little impedance. The controlled rectifier remains conductive in this manner even though the positive gate potential is removed. The controlled rectifier can subsequently be commutated, i.e., turned off, by reversing the potential in the anode-cathode circuit, or, in other words, by making the anode negative with respect to the cathode.

A capacitor 7 is connected in series with a resistor 8 between a positive source of potential and ground to form a capacitor charging circuit. The junction 9 between resistor 8 and capacitor 7 is connected to the anode of controlled rectifier 3 via diode 10, the anode thereof connected to the anode of the controlled rectifier. The cathode of a four-layer diode 11 is connected to junction 9, and the anode thereof is connected to a positive source of potential via resistor 12. The junction 13 at the anode of four-layer diode 11 is connected to the anode of controlled rectifier 3 through capacitor 14.

A four-layer diode is a PNPN semiconductor device similar to a controlled rectifier except that internal feedback connections eliminate the need for a gate element. Normally, this diode has a high impedance to current flow in both directions. When the potential applied across the diode exceeds the breakdown potential, the diode becomes fully conductive in the anode to the cathode direction and thereafter remains conductive in this manner even though the applied potential may be reduced. The diode turns off and becomes nonconductive when the current flow through the diode drops below the current holding level for the diode.

Four-layer diode 11 is selected to have a breakdown potential less than the maximum potential attained by fully charged capacitor 7. The values of capacitor 7 and resistor 8 are selected to provide the desired time constant for the multivibrator circuit, the time constant being the time required for capacitor 7 to charge up to the breakdown potential of four-layer diode 11. Resistor 8 can be of sufficiently high resistance value to reduce current flow through the four-layer diode to below the holding level after capacitor 7 has discharged.

In explaining the operation of this monostable multivibrator circuit, it is assumed that, initially, the controlled rectifier and the four-layer diode are nonconducting and therefore no current flows through winding 1. Under these circumstances, since there is no potential drop across resistor 2 or winding 1, junction 9 is effectively clamped at the potential of the positive source by means of diode 10. Since essentially the same potential is applied to both plates of capacitor 7, the capacitor cannot charge.

When a trigger pulse is applied between terminals 6 and 5, a positive potential is applied to the gate element of controlled rectifier 3, rendering this rectifier conductive. When the rectifier becomes conductive, current immediately begins flowing through winding 1 and maintains the controlled rectifier in the conductive state even though the trigger potential is removed. The conductive controlled rectifier provides a very low impedance between the anode and cathode thereof, and nearly the entire supply voltage appears across resistor 2 and inductance 1. Therefore diode 10 becomes back biased and the clamping effect at junction 9 is eliminated. Accordingly, capacitor 7 begins to charge through resistor 8 and continues to charge until the potential across four-layer diode 11 exceeds the breakdown value. When this event occurs, the diode becomes conductive and capacitor 7 is discharged through resistor 12.

At the time when the controlled rectifier is conductive and the four-layer diode is not conductive, one plate of capacitor 14 is effectively connected to ground through the controlled rectifier, and the other plate is connected to the positive source of potential through resistor 12. Under these circumstances, capacitor 14 becomes charged with the polarity shown in the diagram. When the four-layer diode subsequently becomes conductive and capacitor 7 discharges through resistor 12, the current flow through the resistance creates a voltage drop, driving the potential at junction 13 in a negative direction. This change of potential at junction 13 causes the plate of the capacitor 14 which is connected to the anode of controlled rectifier 3 to become correspondingly more negative, this plate being driven below ground potential sufficiently to reverse bias and therefore commutate controlled rectifier 3. A short time thereafter, capacitor 7 becomes completely discharged and therefore current flow through four-layer diode 11 drops below the holding level and the diode regains its non-conductive state. A second mechanism for forcing the four-layer diode 11 into its non-conductive state also takes place if the ratio of the impedances of resistor 2, coil 1, to resistor 8 is in the order of 1 to 10. As controlled rectifier 3 turns off and its anode assumes the positive supply potential, the clamping action of diode 10 will tend to collapse the voltage across the four-layer diode 11 below a value necessary to sustain holding current through resistor 12. The four-layer diode will then be caused to turn off. If the above mentioned impedance ratios are low, however, the voltage divider action could cause point 9 to assume a sufficiently negative value to allow holding current to flow through resistor 12 and the four-layer diode 11.

Accordingly, it is seen that the operating cycle is initiated by a positive pulse applied to terminals 5 and 6 which renders the controlled rectifier conductive. When the controlled rectifier conducts, the clamp potential is removed at junction 9, permitting capacitor 7 to charge. When capacitor 7 has reached the breakdown potential of the four-layer diode 11, the diode becomes conductive, and through capacitor 14 is effective to commutate the controlled rectifier. Each positive pulse at terminals 5 and 6 therefore results in a current flow through winding 1 of a predetermined time duration.

Figure 2:
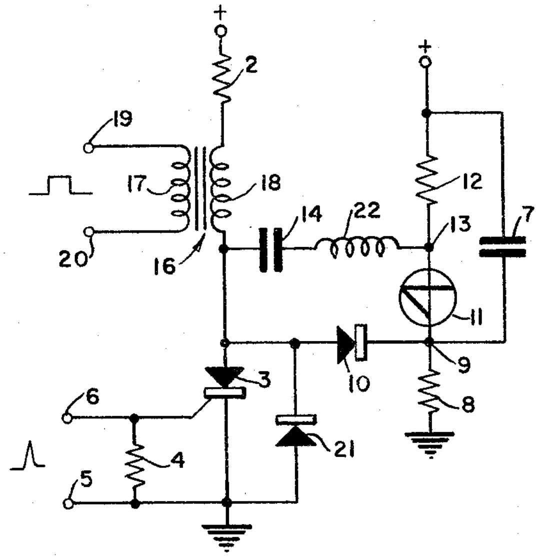
FIG. 2 is a schematic diagram illustrating a monostable multivibrator in accordance with a second embodiment.

A monostable multivibrator circuit in accordance with a second embodiment of this invention is illustrated in FIG. 2. Many of the components are connected and are operated in essentially the same manner as in the FIG. 1 embodiment and therefore like reference numerals are employed.

The inductive winding 1 in FIG. 1 is replaced by a transformer 16 having a secondary winding 17 connected to output terminals 19 and 20, and a primary winding 18 connected between resistance 2 and the anode of controlled rectifier 3. Accordingly, the output from the monostable multivibrator is available as pulses appearing at terminals 19 and 20.

In some installations, it is desirable to prevent the commutating pulse supplied to the controlled rectifier via capacitor 14 from having any substantial effect on the output pulse. This effect is eliminated by connecting a diode 21 across the anode-cathode circuit of controlled rectifier 3, with the cathode of diode 21 connected to the anode of the controlled rectifier and the anode of diode 21 connected to ground. When the commutating potential is applied via capacitor 14, the anode of the controlled rectifier goes negative and therefore diode 21 begins to conduct. The forward conducting voltage drop of conventional diodes, such as diode 21, is approximately 1 volt and thus the anode of the controlled rectifier is prevented from ever going more than 1 volt negative. The negative 1 volt is sufficient to commutate the controlled rectifier, but is relatively insignificant when compared to the magnitude of the output pulse developed in transformer 16.

Since the magnitude of the commutating potential applied to the controlled rectifier has effectively been decreased by diode 21, it may be necessary to increase the time duration of this negative potential. This is accomplished by adding an inductor 22 in series with the capacitor 14 connected between the capacitor and junction 13. With this series LC circuit, the time duration of the negative potential applied to the controlled rectifier is determined by the time constant of the circuit, and by appropriate selection of components can be made sufficiently long to insure commutation.

Figure 3:
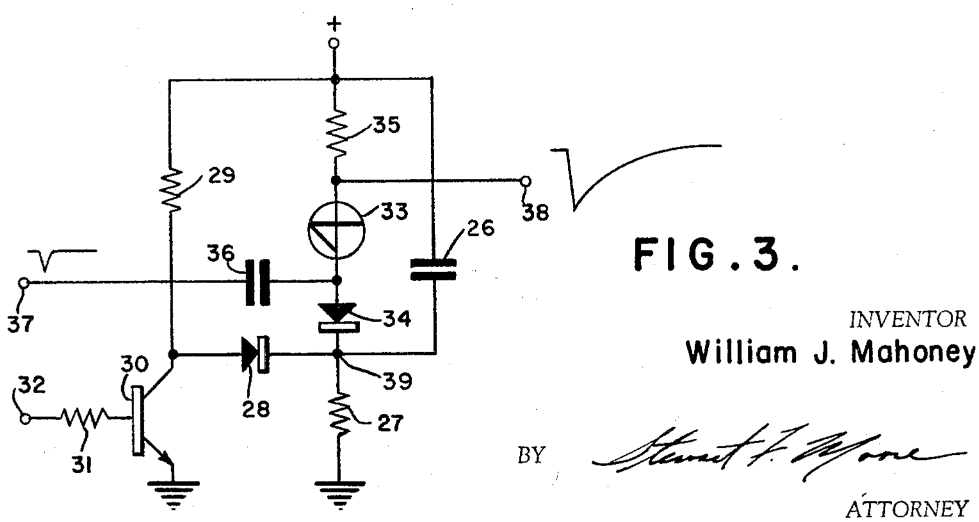
FIG. 3 is a schematic diagram illustrating a triggered one-shot oscillator.

A triggered one-shot oscillator is illustrated schematically in FIG. 3. This circuit is specially arranged to be insensitive to miscellaneous noise pulses.

A charging circuit is formed by capacitor 26 in series with resistor 27 between a positive source of potential and ground. A series circuit, including four-layer diode 33, diode 34 and resistor 35, is connected across capacitor 26. The anode of the four-layer diode is connected to the positive source of potential via resistor 35, and the cathode of the diode is connected to junction 39 via diode 34, junction 39 being between resistor 27 and capacitor 26. Input terminal 37 is connected to the cathode of four-layer diode 33 via capacitor 36, and the output terminal of capacitor 36 is connected to the anode of the four-layer diode.

Four layer diode 33 is so selected that it will not break down when capacitor 26 becomes fully charged. In other words, a four-layer diode is selected having a breakdown voltage somewhat in excess of that supplied by the positive source of potential, so that, when the capacitor 26 becomes fully charged, the diode will not break down and conduct. Four-layer diode 33 can be rendered conductive by supplying a sufficiently negative pulse from terminal 37 via capacitor 36. This negative potential when added in series with the voltage already across four-layer diode 33 provided by capacitor 26 causes the cathode of the four-layer diode to become sufficiently negative to render the diode conducting and permit capacitor 26 to thereafter discharge through resistor 35, four-layer diode 33 and diode 34. The discharge current provides a potential drop across resistor 35 and thus provides a negative output pulse at terminal 38. Output pulses at terminal 38 are uniform, since the magnitude of the pulse is primarily dependent upon the energy stored in capacitor 26.

In order to render this one-shot circuit insensitive to noise pulses which could be applied at terminal 37, the circuit including transistor 30 is added. Transistor 30 is of the NPN type, the collector thereof being connected to the positive source of potential via resistor 29, and the emitter thereof being connected to ground. The base element of transistor 30 is connected to an input terminal 32 via resistor 31. Diode 28 is connected between the collector of transistor 30 and junction 39, the cathode of the diode being connected to junction 39.

When transistor 30 is nonconductive and resistor 29 is small in comparison to resistor 27, diode 28 clamps junction 39 at a very positive potential. Under these circumstances, capacitor 26 cannot charge, since a positive potential is applied to both plates of the capacitor. Also, when junction 39 is positive, there is very little potential drop across the four-layer diode and therefore an extremely large negative pulse would be required at terminal 37 in order to render the four-layer diode conductive. Accordingly, when transistor 30 is not conductive, the four-layer diode is relatively insensitive to incoming pulses, and even if the four-layer diode is rendered conductive no output pulse results, since capacitor 26 is not charged.

If a positive potential is applied at terminal 32, transistor 30 becomes conductive, effectively connecting the anode of diode 28 to ground. Under these circumstances, diode 28 becomes back biased and the clamping effect at junction 39 is eliminated. Capacitor 26 therefore can become fully charged, and subsequently when a relatively small negative pulse is applied to terminal 37 the four-layer diode is rendered conductive, producing an output pulse at terminal 38.

Thus, it is seen that the one-shot circuit operates normally if a positive potential is applied at terminal 32 and therefore produces negative output pulses at terminal 38 in response to negative trigger pulses applied at terminal 37. If the positive potential is removed from terminal 32, both the charging circuit and the four-layer diode discharging circuit are effectively disabled and therefore the one-shot circuit is relatively insensitive to any noise pulses which may appear at terminal 37. The circuit of FIG. 3 may also be utilized to provide the logic AND configuration. In this service no output can appear at terminal 38 unless both transistor 30 is made conducting and a negative pulse is provided at input terminal 37. If transistor 30 is nonconducting, a normal amplitude negative pulse appearing at terminal 37 cannot cause conduction of the four-layer diode 33 and a subsequent output pulse.

While only a limited number of embodiments illustrating the present invention have been shown, it is obvious that numerous modifications could be made without departing from the scope of this invention. The scope of the invention is more particularly defined in the appended claims.

What is claimed is:

1. A monostable multivibrator circuit comprising, a load, a source of energy for supplying electrical current to said load, a controlled rectifier having output electrodes and a control electrode, said output electrodes being connected in series circuit relationship with said source of energy and said load and operative to control the current flow therethrough, means connected to said control electrode and operative in response to a signal generated externally of said multivibrator circuit for triggering said controlled rectifier from a nonconductive to a conductive state, and control circuit means for placing said controlled rectifier in a nonconductive state at the end of a predetermined timing period initiated when said controlled rectifier is triggered into a conductive state, said control circuit means comprising a breakdown diode having a pair of output terminals and responsive to a predetermined potential developed across said terminals to change from a high impedance to a low impedance state, a charging capacitor and resistor serially connected across said terminals and to said source of energy to form an RC charging circuit for applying a potential to said terminals having a magnitude which increases with time until said predetermined potential is reached, a commutating capacitor connected between one of said terminals and one of said output electrodes of said controlled rectifier, a coupling diode connected between another of said terminals and said one of said output electrodes, said coupling diode being operative to prevent said charging capacitor from charging until said controlled rectifier is triggered into a conductive state, said control circuit means further including means operative to charge said commutating capacitor to a predetermined voltage when said controlled rectifier is conducting and apply said voltage across said controlled rectifier terminals to turn said controlled rectifier off when said breakdown diode changes to a low impedance state.

2. A pulse generator comprising a source of electrical potential having a pair of output terminals, a serially connected resistor and capacitor forming an RC charging circuit connected across said output terminals and charged by said source of potential, a discharging circuit including a semiconductor device having a predetermined breakdown potential and a diode serially connected across said capacitor, said source of potential being less than the breakdown potential of said semiconductor device, an input pulse receiving terminal connected to the junction of said diode and said semiconductor device, means for applying an input pulse to said terminal of a selected polarity and magnitude sufficient to cause said semiconductor device to breakdown and discharge said capacitor, output means connected to said semiconductor device to provide an output pulse when said semiconductor device breaks down and becomes conductive, disabling circuit means including a clamping diode connected across said capacitor to prevent said capacitor from charging and said semiconductor device from discharging, and means operative in response to an external signal for biasing said clamping diode into a nonconductive state to incapacitate said disabling circuit.

3. A monostable multivibrator circuit comprising a load, a source of energy for supplying electrical current to said load, a controlled rectifier having triggering means operative in response to a signal generated externally of said multivibrator for triggering said controlled rectifier from a normal nonconductive state to a fully conductive state, said controlled rectifier being connected in series circuit relationship with said source of energy and said load and operative to control the current flow therethrough, control circuit means connected to said controlled rectifier at a point in said series circuit, said control circuit means having OFF and ON states, said control circuit means being inoperative when in said OFF state and being ON and in an operative state only when said controlled rectifier is in a conductive state, said control circuit means including a commutating circuit comprising a voltage source capable of producing a voltage which increases in magnitude with time, said voltage source including a capacitor and a capacitor charging circuit and means operative in response to the triggering of said controlled rectifier into conduction to turn said control circuit ON and initiate a voltage timing period, said last mentioned means including a diode connected serially between said capacitor and said point in said series circuit operative to prevent said capacitor from commencing to charge until said controlled rectifier is conductive, said voltage timing period being terminated when the voltage of said source reaches a predetermined magnitude, said control circuit means including means connected to said voltage source and operative in response to said predetermined magnitude of said voltage to return said controlled rectifier to a nonconductive state and cause said current to cease to flow through said load.

4. A monostable multivibrator circuit in accordance with claim 1 and further comprising asymmetrically conductive circuit means connected in parallel circuit relationship with said controlled rectifier to conduct in a direction opposite to the primary conductive direction of said controlled rectifier.

5. A monostable multivibrator circuit in accordance with claim 1 and further comprising inductor means connected in series circuit relationship with said commutating capacitor for extending the conductive time period of said controlled rectifier.

References Cited by the Examiner

UNITED STATES PATENTS

| | | | |
|---|---|---|---|
| 2,874,333 | 2/1959 | Gray | 315—220 X |
| 3,015,739 | 1/1962 | Manteuffel | 307—88.5 |
| 3,018,392 | 1/1962 | Jones | 307—88.5 |
| 3,040,270 | 6/1962 | Gutzwiller | 307—88.5 |
| 3,050,639 | 8/1962 | Tate | 307—88.5 |
| 3,078,391 | 2/1963 | Bunodiere et al. | 307—88.5 |
| 3,085,165 | 4/1963 | Schaffert et al. | 307—88.5 |
| 3,109,965 | 11/1963 | Winchel | 307—88.5 |
| 3,162,772 | 12/1964 | Smith | 307—88.5 |
| 3,164,767 | 1/1965 | Morgan | 307—88.5 |
| 3,168,704 | 2/1965 | Gibbons | 307—88.5 |
| 3,169,232 | 2/1965 | Engman et al. | 307—88.5 |
| 3,171,036 | 2/1965 | Sokoler | 307—88.5 |
| 3,175,098 | 3/1965 | Grace | 307—88.5 |
| 3,193,701 | 7/1965 | Lawhon | 307—88.5 |

ARTHUR GAUSS, *Primary Examiner.*

J. JORDAN, *Assistant Examiner.*